US012799625B2

(12) United States Patent
Wang et al.

(10) Patent No.: US 12,799,625 B2
(45) Date of Patent: Nov. 17, 2026

(54) METHOD FOR PREPARING COMPOUND SEMICONDUCTOR CRYSTAL BY COMBINING CONTINUOUS LEC AND VGF AFTER INJECTION SYNTHESIS

(71) Applicant: THE 13TH RESEARCH INSTITUTE OF CHINA ELECTRONICS TECHNOLOGY GROUP CORPORATION, Shijiazhuang (CN)

(72) Inventors: Shujie Wang, Shijiazhuang (CN); Niefeng Sun, Shijiazhuang (CN); Aimin Bu, Shijiazhuang (CN); Lijie Fu, Shijiazhuang (CN); Huimin Shao, Shijiazhuang (CN); Zheng Liu, Shijiazhuang (CN); Senfeng Xu, Shijiazhuang (CN); Yanlei Shi, Shijiazhuang (CN); Xiaolan Li, Shijiazhuang (CN); Yang Wang, Shijiazhuang (CN); Tongnian Sun, Shijiazhuang (CN)

(73) Assignee: The 13th Research Institute of ChinaElectronics Technology Group Corporation, Shijiazhuang (CN)

( * ) Notice: Subject to any disclaimer, the term of this patent is extended or adjusted under 35 U.S.C. 154(b) by 500 days.

(21) Appl. No.: 18/294,938

(22) PCT Filed: Dec. 8, 2021

(86) PCT No.: PCT/CN2021/136319
§ 371 (c)(1),
(2) Date: Feb. 2, 2024

(87) PCT Pub. No.: WO2022/252544
PCT Pub. Date: Dec. 8, 2022

(65) Prior Publication Data

US 2024/0209545 A1 Jun. 27, 2024

(30) Foreign Application Priority Data

Jun. 1, 2021 (CN) ........................ 202110606788.0

(51) Int. Cl.
*C30B 27/02* (2006.01)
*C30B 29/40* (2006.01)

(52) U.S. Cl.
CPC .............. *C30B 27/02* (2013.01); *C30B 29/40* (2013.01)

(58) Field of Classification Search
CPC ......... C30B 11/00; C30B 15/00; C30B 27/02; C30B 29/40; C30B 29/403
See application file for complete search history.

(56) References Cited

U.S. PATENT DOCUMENTS

| | | | | |
|---|---|---|---|---|
| 3,305,485 A * | 2/1967 | Burmeister | ............ | C30B 29/46 392/479 |
| 4,863,554 A * | 9/1989 | Kawasaki | .............. | C30B 15/14 117/34 |

(Continued)

FOREIGN PATENT DOCUMENTS

| | | | |
|---|---|---|---|
| CN | 101054723 A | 10/2007 | |
| CN | 113308738 A | 8/2021 | |

(Continued)

OTHER PUBLICATIONS

English computer translation of JP-2004107120-A (Year: 2026).*

(Continued)

*Primary Examiner* — Matthew J Song
(74) *Attorney, Agent, or Firm* — AP3 Law Firm PLLC

(57) ABSTRACT

The present invention discloses a method for preparing a compound semiconductor crystal by continuous LEC and VGF combination after injection synthesis, including: step A, vacuuming a system for preparing compounds and filling the system with an inert gas; step B, heating to melt the (Continued)

metallic raw material and boron oxide I in a synthesis crucible; step C, heating to melt boron oxide II, and moving the synthesis injection system downwards to move the end of the injection synthesis tube until the metallic raw material in the crucible is synthesized into a first melt; step D, slowly reducing the pressure inside the VGF crucible so that the first melt enters the VGF crucible to form a second melt; etc.

9 Claims, 6 Drawing Sheets

(56) References Cited

U.S. PATENT DOCUMENTS

| | | | | |
|---|---|---|---|---|
| 5,290,395 | A * | 3/1994 | Matsumoto | C30B 15/12 117/17 |
| 2019/0352794 | A1 * | 11/2019 | Wang | C30B 11/001 |
| 2021/0285123 | A1 * | 9/2021 | Wang | C30B 11/001 |

FOREIGN PATENT DOCUMENTS

| | | | | |
|---|---|---|---|---|
| CN | 113308739 | A | 8/2021 | |
| JP | 2004107120 | A * | 4/2004 | C30B 15/00 |

OTHER PUBLICATIONS

International Preliminary Report on Patentability mailed Nov. 21, 2023 in PCT/CN2021/136319 filed Dec. 8, 2021.
International Search Report and Written Opinion mailed Mar. 1, 2022 in PCT/CN2021/136319 filed Dec. 8, 2021.

* cited by examiner

METHOD FOR PREPARING COMPOUND SEMICONDUCTOR CRYSTAL BY COMBINING CONTINUOUS LEC AND VGF AFTER INJECTION SYNTHESIS

CROSS-REFERENCE

This application claims the priority of PCT Application Publication No. WO/2022/252544, filed on Dec. 8, 2021, which claims priority to Chinese Patent Application No. 202110606788.0, filed on Jun. 1, 2021, the entirety of which is hereby incorporated by reference.

FIELD OF THE INVENTION

The present invention relates to a method for preparing a compound semiconductor crystal by continuous LEC and VGF combination after injection synthesis, and is particularly applicable to compound semiconductors having volatile elements, for example, indium phosphide, gallium phosphide and other materials.

BACKGROUND OF THE INVENTION

Compound semiconductor materials such as indium phosphide and gallium phosphide are widely used in many high-tech fields such as optical fiber communications, microwave and millimeter-wave devices and solar cells, and are widely used in aerospace, network communications, radar, and other military and civilian fields.

The synthesis methods of compound semiconductors mainly include: direct synthesis, diffusion synthesis and injection synthesis, etc. For indium phosphide, gallium phosphide and other substances with high saturated vapor pressure, diffusion synthesis and injection synthesis are usually required. Injection synthesis can significantly shorten the synthesis time, can avoid the introduction of impurities, and improve the purity of materials. The direct crystal preparation after injection synthesis can reduce both the crystal preparation time and the number of preparation steps, dramatically improving the physical quality of crystals.

The most commonly used methods for growing semiconductor crystals include: Liquid Encapsulated Czochralski (LEC), Vapor Pressure-Controlled Czochralski (VCZ), Hot Wall Czochralski (HWC), and Fully Encapsulated Czochralski (FEC). Bridgman technologies are divided into Vertical Bridgman (VB), Horizontal Bridgman (HB), Vertical Gradient Freezing (VGF) and Horizontal Gradient Freezing (HGF), etc.

The Liquid Encapsulated Czochralski (LEC) and the Liquid Encapsulated Czochralski (VGF) are the most dominant methods for preparing compound semiconductors such as indium phosphide and gallium phosphide. A high growth interface temperature gradient can be obtained using the Liquid Envelope Pulling (LEC), and the prepared crystals are high in yield, but high in defect density. Vertical Gradient Freezing (VGF) can prepare crystals with low defects due to the characteristics such as low temperature gradient and stable thermal field at the growth interface, but the yield is low.

SUMMARY OF THE INVENTION

The technical problem to be solved by the present invention is to provide a method for preparing a compound semiconductor crystal by continuous LEC and VGF combination after injection synthesis, in which the growth of an LEC and VGF combined crystal is realized at the upper part, and the injection synthesis of a melt is realized at the lower part; and the melt is sucked back into a VGF crucible by gas pressure control. The present invention starts with LEC seeding and diameter enlarging at a high temperature gradient to suppress twin crystals, and then prepares a low-defect crystal by performing VGF growth in the remaining melt in the VGF crucible. High-quality crystals with low defects can be prepared with high yield.

In order to solve the above problems, the technical solution adopted by the present invention is as follows: a method for preparing a compound semiconductor crystal by continuous LEC and VGF combination after injection synthesis, which is based on a system for preparing compounds, the system comprising a main furnace body, an upper furnace body located above the main furnace body, a synthesis crucible and an injection synthesis system located in the main furnace body, and a VGF crucible and a seed crystal rod located in the upper furnace body, the synthesis crucible being loaded with a metallic raw material and boron oxide I, the VGF crucible being loaded with boron oxide II, the VGF crucible being provided with a suction tube at the bottom, and the synthesis injection system being filled with a non-metallic raw material, wherein the method in the present invention comprises the following steps:

- step A, vacuuming the system for preparing compounds to 10-5 Pa to 10 Pa, and then filling the system with an inert gas;
- step B, heating the synthesis crucible to a synthesis temperature to melt the metallic raw material and the boron oxide I in the synthesis crucible, and then moving the synthesis crucible upwards to a synthesis position;
- step C, heating the VGF crucible to a temperature above the melting point of the compound semiconductor crystal and to melt the boron oxide II in the VGF crucible, moving the synthesis injection system downwards to move the end of an injection synthesis tube until the metallic raw material in the synthesis crucible is synthesized into a first melt, and after completion of the synthesis, moving the synthesis injection system upwards so that the end of the injection synthesis tube is detached from the first melt;
- step D, slowly reducing the pressure inside the VGF crucible so that the first melt in the synthesis crucible enters into the VGF crucible via a suction tube to form a second melt;
- step E, heating the VGF crucible such that the second melt therein obtains a temperature gradient of 20-50 K/cm and the boron oxide II obtains a temperature gradient of 100-150 K/cm;
- step F, initiating rotation and lowering of the seed crystal, lowering the seed crystal rod until the seed crystal comes into contact with the second melt, then lifting the seed crystal rod for crystal growth, and stopping the rotation and pulling of a seed crystal when the size of the crystal is close to the crucible wall of the VGF crucible;
- step G, after completion of the crystal growth, adjusting the heating temperature so that the second melt obtains a temperature gradient of 3-5 K/cm, to control VGF growth; and
- step H, after completion of temperature reduction, stopping the heating and communicating the interior of the system with the atmosphere, and removing the crystal.

The present invention has the following beneficial effect: the upper part is a VGF growth part and the lower part is a synthesis part; the VGF growth part is accessed by reverse sucking, while the VGF growth part is configured with a seed crystal rod and an observation system, and also can be subjected to gas control. At the beginning, the LEC seeding and diameter enlarging at a high temperature gradient are implemented, and then the grown crystal is used for VGF crystal growth at a low temperature gradient, so that a high-quality crystal with low defects can be prepared with high yield;

the VGF crucible is designed, the synthesized melt is sucked into the crucible through the suction tube, an internal storage tank formed therein exists for storing boron oxide required for VGF and LEC growth. The boron oxide here can cover the inner wall of the VGF tube as the melt rises, which facilitates the whole crystal to be detached from the crucible at the later stage;

an adapter fixture is designed to connect the upper furnace cover to the VGF crucible, and is internally provided with water cooling, while the end face of the VGF crucible is sealed by a snap ring and a rubber ring, and airflow is blocked through a cooling column and a VGF crucible retaining ring structure to further lower the temperature near the rubber ring; and in the synthesis process, if the optimal position of the synthesis crucible allows the bottom of the suction tube to be inserted into the first melt or boron oxide I inside the synthesis crucible, an inert gas is injected through the VGF crucible to prevent first melt or the boron oxide I from being sucked back in the synthesis process.

The present invention will be described in detail below in conjunction with the drawings.

In which: 1: main furnace body; 1-1 main furnace body opening; 2: upper furnace body; 2-1: upper furnace cover; 3: base; 4: main column; 4-1: upper furnace body driving device; 4-2: first auxiliary rod; 4-3: main furnace body driving device; 4-4: second auxiliary rod; 5: upper furnace body support table; 5-1: upper furnace body cleaning hole; 5-2: upper furnace body support table post; 6: main furnace body support table; 6-1: main furnace body cleaning hole; 6-2: main furnace body support table post; 7: seed crystal rod driving device loading platform; 8: seed crystal rod driving device; 9: seed crystal rod; 10: upper observation window; 11: adapter fixture; 11-1: balance gas tube; 11-2: first seal ring; 11-3: second seal ring; 11-4: snap ring; 11-5: screw hole; 11-6: adapter hole; 11-7: center hole; 11-8: seal groove; 11-9: observation hole; 11-10: crucible clamp slot; 11-11: cooling stud; 12: first synthesis drive motor; 13: second synthesis drive motor; 14: lower observation window; 15: synthesis rotating rod; 16: synthesis injection system; 16-1: injection synthesis heater; 16-2: loader; 16-3: injection synthesis tube; 17: synthesis crucible; 18: crucible support; 19: main heater; 19-1: auxiliary heater; 20: first melt; 21: first insulation sleeve; 22: crucible rod; 23: crucible rod drive; 24: crucible rod drive loading platform; 25: gas filling tube; 26: vacuum tube; 27: crucible rod thermocouple; 28: upper insulation layer housing; 29: VGF crucible; 29-1: suction tube; 29-2: extension tube; 29-3: storage tank; 29-4: VGF crucible support; 29-5: VGF crucible retaining ring; 30: upper insulation layer; 31: first heater; 32: second heater; 33: third heater; 34: fourth heater; 35: fifth heater; 36: suction tube heater; 37: suction tube insulation layer; 38: first thermocouple; 39: second thermocouple; 40: third thermocouple; 41 fourth thermocouple; 42: seed crystal rod thermocouple; 43: seed crystal holder; 44: seed crystal; 45: second melt; 46: crystal; 47: boron oxide I; 47-1: boron oxide II; 48: pure indium; 49: fastening screw; 50: red phosphorus; 51: differential pressure gauge; and 52: differential pressure tube.

DETAILED DESCRIPTION OF THE EMBODIMENTS

Figure 1:
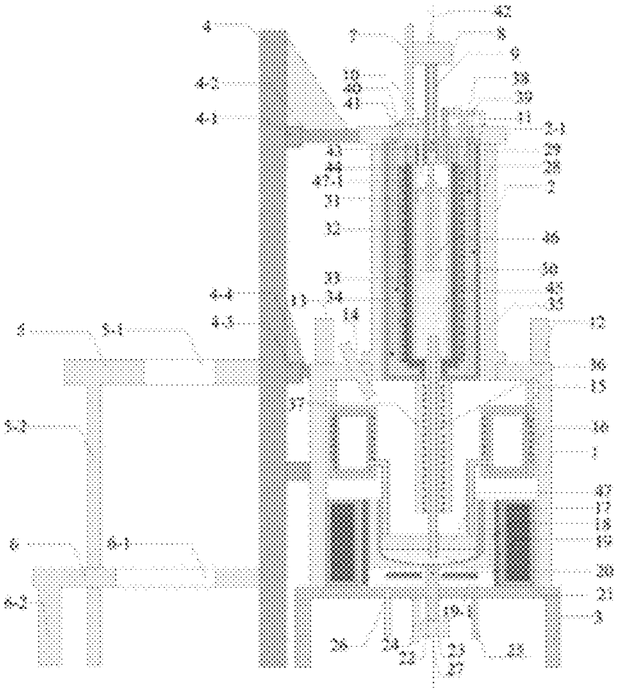
FIG. 1 is a structure diagram of a system for preparing compounds in a method of the present invention.

Refer to FIG. 1, a method in the present invention for preparing a compound semiconductor crystal by continuous LEC and VGF combination after injection synthesis is achieved based on a system for preparing compounds.

The system above includes a rack, a main furnace body 1, an upper furnace body 2 located above the main furnace body 1, a synthesis crucible 17 disposed in the main furnace body 1, a VGF crucible 29 disposed in the upper furnace body 2, a seed crystal rod 9, synthesis injection systems 16 and other components. The synthesis crucible 17 is loaded with a metallic raw material and boron oxide I 47 therein, the VGF crucible 29 is loaded with boron oxide II 47-1 therein, and the synthesis injection systems 16 are loaded with a non-metallic raw material therein.

The rack includes a base 3, a main column 4, an upper furnace support table 5, and a main furnace body support table 6. The main column 4 is provided with an upper furnace body driving device 4-1, a first auxiliary rod 4-2, a main furnace body driving device 4-3 and a second auxiliary rod 4-3. The main furnace body 1 is connected to the main furnace body driving device 4-3 connected to the main column 4 via the second auxiliary rod 4-4. The main furnace body 1 is driven by the movement of the main furnace body driving device 4-3 to perform lifting and rotating movements so as to facilitate moving the main furnace body 1 to the base 3 and the main furnace body support table 6. The upper furnace cover 2-1 in the upper furnace body 2 is connected to the upper furnace body driving device 4-1 connected to the main column 4 through the first auxiliary rod 4-2. The upper furnace body driving device 4-1 drives the upper furnace cover 2-1 to perform lifting up/down and rotating movements, so that the upper furnace body 2 can be moved onto the main furnace body 1 and the upper furnace body support table 5. The main furnace body driving device 4-3 and the upper furnace body driving device 4-1 may be a linearly driven device such as a cylinder driven by a rotating motor. During assembly and disassembly of the furnace body, the upper furnace body 2 is movable onto the upper furnace body support table 5 and the main furnace body 1 is movable onto the main furnace body support table 6. The upper furnace body support table 5 is provided with an upper furnace body cleaning hole 5-1 and an upper furnace body support table post 5-2. The main furnace body support table 6 is provided with a main furnace body cleaning hole 6-1 and a main furnace body support table post 6-2. The maximum height of the main column 4 is a height that the low end of the suction tube 29-1 can be detached from the highest end of the main furnace body 1 after the upper furnace body 2 is raised.

The seed crystal rod 9 with a seed crystal 44 fixed at the bottom is rotated and moved up and down through a seed crystal rod driving device 8. The seed crystal rod driving device 8 is assembled on a seed crystal rod drive loading platform 7 connected to the upper furnace cover 2-1 to achieve up and down movements and rotation of the seed crystal rod 9. The seed crystal rod driving device 8 includes a rotating assembly and a lifting assembly. The rotating assembly includes a rotating motor and an intermediate plate connected to a rotating shaft of the rotating motor; and the lifting assembly is fixed to the intermediate plate, and includes an electric drive pusher, the tail end of which is connected to the seed crystal rod 9. It is also possible that the lifting assembly includes an electric drive pusher, the tail end of which is connected to an intermediate plate, and the rotating assembly includes a rotating motor fixed to the intermediate plate and a seed crystal rod 9 connected to the rotating shaft of the rotating motor.

The main furnace body 1 is fixed to the base 3. A crucible support 18 is disposed inside the main furnace body 1, and a synthesis crucible 17 is disposed inside the crucible support 18. The main furnace body 1 is also provided with an upper observation window 10. The base 3 is provided with a gas filling tube 25 and an vacuum tube 26 in communication with the main furnace body 1.

A crucible support driving device is disposed below the main furnace body 1 to drive the crucible support 18 for rotation and up and down movements. The crucible support driving device includes a crucible rod 22 and a crucible rod drive 23. The crucible rod 22 passes upwardly through the base 3 to enter the interior of the main furnace body 1 and is connected to the crucible support 18. The crucible rod drive 23 is assembled on the crucible rod drive loading platform 24 for up and down movements and rotation. The crucible rod 22 is also provided with a crucible rod thermocouple 27. The crucible rod drive 23 includes an electric drive pusher fixed to the crucible rod drive loading platform 24, a connection plate connected to the electric drive pusher, a rotating motor fixed to the connection plate, the rotating shaft of the rotating motor being connected to the crucible rod 22.

A heating system is disposed outside the crucible support 18. The heating system includes a main heater 19 and an auxiliary heater 19-1. The crucible support 18 and the synthesis crucible 17 are heated by means of the main heater 19 surrounding the crucible support 18 and the auxiliary heater 19-1 located at the lower part of the main heater 19. In addition, a first insulation sleeve 21 for thermal insulation of the heating system is disposed outside the main heater 19.

Figure 7:
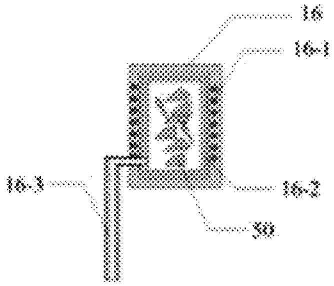
FIG. 7 is a schematic view of an injection synthesis system.

Refer to FIG. 7, the synthesis injection system 16 includes an injection synthesis heater 16-1, a loader 16-2 and an injection synthesis tube 16-3. A first synthesis drive motor 12 and a second synthesis drive motor 13 are disposed at the upper part of the upper main furnace body 1, and the first synthesis drive motor 12 and the second synthesis drive motor 13 are each connected to the corresponding synthesis injection system 16 via a synthesis rotating rod 15 and drive the synthesis injection system 16 to rise or fall so that the injection synthesis tube 16-3 is inserted into the interior of the synthesis crucible 17. The synthesis drive motor and the synthesis rotating rod 15 are connected to each other by a screw nut mechanism or a rack and pinion mechanism to drive the synthesis injection system 16 to rise or fall.

Figure 2:
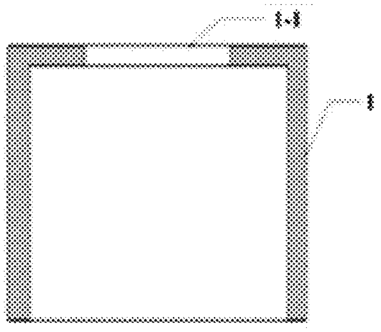
FIG. 2 is a structure diagram of a main furnace body.
Figure 3:
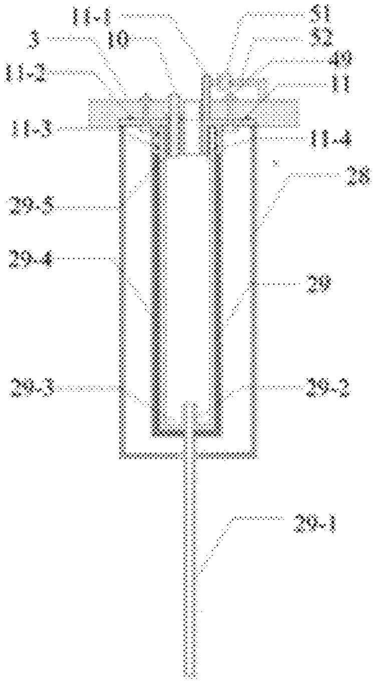
FIG. 3 is a schematic diagram of assembly of an adapter fixture, an upper furnace cover and a VGF crucible.
Figure 4:
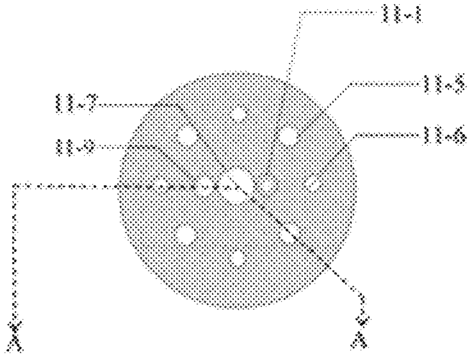
FIG. 4 is a front view of the adapter fixture.
Figure 5:
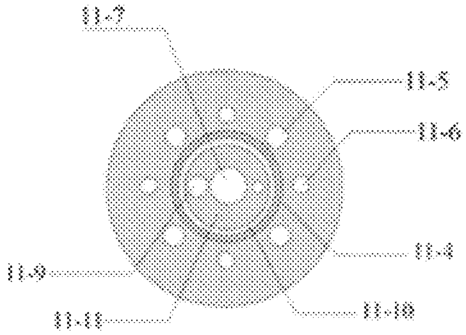
FIG. 5 is a rear view of the adapter fixture.
Figure 6:
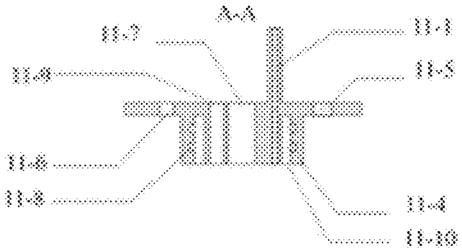
FIG. 6 is a sectional view of FIG. 4 in the direction of A-A.

Refer to FIGS. 1 and 2, the upper furnace body 2 is disposed at the main furnace body opening 1-1 on the main furnace body 1. The upper furnace cover 2-1 forms a sealed furnace chamber together with the upper furnace body 2, the main furnace body 1 and the base 3.

Refer to FIGS. 1, and 3 to 6, the upper furnace cover 2-1 is provided with an adapter fixture 11 on the inner side thereof, and the VGF crucible 29 is disposed in the upper furnace body 2 by means of the adapter fixture 11. Specifically, screw holes 11-5 are formed in the adapter fixture 11, and fastening screws 49 pass through the screw holes 11-5 to fix the adapter fixture 11 to the upper furnace cover 2-10. Seal grooves are formed in the contact surfaces of the upper furnace cover 2-1 with the adapter fixture 11, and first seal rings 11-2 are disposed in the seal grooves. The nuts of the fastening screws 49 face inwards during connection, and air leakage along the gap between contact surfaces of the upper furnace cover and the adapter fixture is prevented through the first seal rings 11-2.

The upper part of the adapter fixture 11 is connected to a balance gas tube 11-1, which passes upwards through the upper furnace cover 2-1 to adjust the pressure in the VGF crucible 29. The upper furnace cover 2-1 is also fitted with a differential pressure tube 52, which is connected to the balance gas tube 11-1. A differential pressure gauge 51 is installed on the differential pressure tube 52 for measuring the pressure difference between the pressure inside the VGF crucible 29 and the pressure inside the furnace body.

The adapter fixture 11 is provided with a snap ring 11-4 and a cooling stud 11-11, and an annular gap between the snap ring 11-4 and the cooling stud 11-11 forms a crucible clamp slot 11-10. Seal grooves 11-8 are formed in the inner side face of the snap ring 11-4 for placement of second seal rings 11-3. The VGF crucible 29 is placed in the crucible clamp slot 11-10 and the sealing between the snap ring 11-4 and the VGF crucible 29 is achieved through the second seal rings 11-3. When the VGF crucible 29 is filled with the boron oxide II 47-1 therein, the thickness of the boron oxide II 47-1 is greater than 2.5 cm for establishing a sufficiently high temperature gradient and lowering the temperature above the boron oxide II 47-1. The distance of the surface of the boron oxide II 47-1 from the snap ring 11-4 and the low end of the cooling stud 11-11 is 15 cm or more. Meanwhile, the cooling stud 11-11 is used to connect an external water circulation device to enable water cooling arrangement inside the snap ring 11-4 and the entire adapter fixture 11, so that the temperature at the second seal rings 11-3 is lowered and the temperature gradient in the boron oxide II 47-1 can be improved. A seed crystal rod thermocouple 42 is located within the snap ring 11-4 horizontally for detecting the atmosphere temperature of a rubber ring near the snap ring 11-4. The low end of the cooling stud 11-11 is inserted into the VGF crucible 29 at a distance greater than the distance from a VGF crucible retaining ring 29-5 to the upper port of the VGF crucible 29.

Four adapter holes 11-6 are formed in the adapter fixture 11 for connecting thermocouples within an upper insulation layer 30. The seed crystal hole in the upper furnace cover 2-1 and the center hole 11-7 of the adapter fixture 11 are concentric holes, which are used for passage of the seed crystal rod 9. The observation hole in the upper furnace cover 2-1 and the observation hole 11-9 in the adapter fixture 11 are concentric holes, which are used for passage of the upper viewing window 10. The upper observation window 10 is connected to the upper furnace cover 2-1 in a sealed manner.

A suction tube 29-1 is disposed at the bottom of the VGF crucible 29, through which the melt is sucked back into the VGF crucible 29. The lower end face of the suction tube 29-1 is 1-5 mm from the bottom of the synthesis crucible 17. The amount of the synthesized first melt 20 in the synthesis crucible 17 is designed to ensure that after the required amount of the second melt 45 is satisfied, the remaining melt in the synthesis crucible 17 is able to immerse the bottom end of the suction tube 29-1 by more than 10 mm. At the joint of the VGF crucible 29 and the suction tube 29-1, an extension tube 29-2 entering into the VGF crucible 29 exists, and the extension tube 29-2 and the VGF crucible 29 can enclose a storage tank 29-3. The boron oxide II 47-1 is placed in the storage tank 29-3, and the height of the extension tube 29-2 is such that the volume of the storage tank 29-3 that can be formed by the extension tube and the VGF crucible 29 is greater than the volume of the melted boron oxide II 47-1, so that the melt does not spill out. The inner wall of the VGF crucible 29 is provided with the VGF crucible retaining ring 29-5 for preventing the hot airflow from entering the space between the VGF crucible 29 and the cooling stud 11-11, lowering the temperature at the second seal ring 11-3.

A VGF crucible support 29-4 is disposed on the outer side of the VGF crucible 29. The VGF crucible support 29-4 is provided with a heating system on the outer side thereof. The heating system includes a first heater 31, a second heater 32, a third heater 33, a fourth heater 34, a fifth heater 35 and a heater 36. The VGF crucible 29 is heated through the first heater 31, the second heater 32, the third heater 33, the fourth heater 34, and the fifth heater 35 on the outer side of the VGF crucible support 29-4; and the suction tube 29-1 is heated through the heater 36. The first heater 31, the second heater 32, the third heater 33, the fourth heater 34, and the fifth heater 35 are provided with an upper insulation layer 30 on the outer layer, and the upper insulation layer 30 is provided with an upper insulation layer housing 28 on the outer side. A suction tube insulation layer 37 is provided around a suction tube heater 36. The VGF crucible 29 is heated through the first heater 31, the second heater 32, the third heater 33, and the fourth heater 34 on the inner side of the upper insulation layer 30. A first thermocouple 38, a second thermocouple 39, a third thermocouple 40, and a fourth thermocouple 41 are disposed in sequence in the vicinity of the first heater 31, the second heater 32, the third heater 33, and the fourth heater 34; and a seed crystal rod thermocouple 42 is disposed inside the seed crystal rod 9. The seed crystal rod 9 can pass through the upper furnace cover 2-1 and the center hole 11-7 in the adapter fixture 11 to enter the VGF crucible 29.

Based on the above system, the present invention proposes a method for preparing a compound semiconductor crystal by continuous LEC and VGF combination after injection synthesis. The synthesis crucible 17 is filled with a metallic raw material and boron oxide I 47, the VGF crucible 29 is filled with boron oxide II 47-1, the VGF crucible 29 is provided with a suction tube 29-1 at the bottom, and the synthesis injection system 16 is filled with a non-metallic raw material. The method includes the following steps.

Step A, the system for preparing compounds is vacuumed to $10^5$ Pa to 10 Pa via the vacuum tube 26, and then the system is filled with an inert gas via the gas filling tube 25.

Step B, the synthesis crucible 17 is heated to the synthesis temperature by the matching heating system to melt the metallic raw material and the boron oxide I 47 in the synthesis crucible 17, and then the synthesis crucible 17 is moved upwards to the synthesis position by the crucible support driving device.

Step C, the VGF crucible 29 is heated to a temperature above the melting point of the compound semiconductor crystal through the matching heating system and the boron oxide II 47-1 in the VGF crucible 29 is melted, the synthesis injection system 16 moves downwards to move the end of the injection synthesis tube 16-3 until the metallic raw material in the synthesis crucible 17 is synthesized into the first melt 20, and after completion of the synthesis, the synthesis injection system 16 moves upwards so that the end of the injection synthesis tube 16-3 is detached from the first melt 20.

The inert gas is slowly filled into the VGF crucible 29 via the balance gas tube 11-1 while synthesizing, the inert gas injects bubbles into the first melt 20 via the suction tube 29-1 at a rate of 0.5-20 bubbles per second; and after completion of the synthesis, the injection of the inert gas into the VGF crucible 29 is stopped, and the suction tube 29-1 is kept at a distance of 1-5 mm from the bottom of the synthesis crucible 17.

Step D, the pressure inside the VGF crucible 29 is slowly reduced by the balance gas tube 11-1 so that the first melt 20 inside the synthesis crucible 17 enters the VGF crucible 29 via the suction tube 29-1 to form the second melt 45.

Step E, the VGF crucible 29 is heated such that the second melt 45 therein obtains a temperature gradient of 20-50 K/cm and the boron oxide II 47-1 obtains a temperature gradient of 100-150 K/cm.

The rate of seeding in this step is 0.5 mm/h to 20 mm/h, and the corresponding rate of temperature reduction is 0.2K/h-25 °C/h.

Step F, rotation and lowering of the seed crystal are initiated, the seed crystal rod 9 is lowered until the seed crystal 44 comes into contact with the second melt 45, then the seed crystal rod 9 is lifted for crystal growth, and the rotation and pulling of the seed crystal are stopped when the size of the crystal 46 is close to the crucible wall of the VGF crucible 29.

Step G, after the crystal growth is completed, the heating temperature is adjusted so that the second melt 45 obtains a temperature gradient of 3-5 K/cm, to control VGF growth.

Step H, after completion of temperature reduction, the heating is stopped and the interior of the system is communicated with the atmosphere and the crystal is removed.

The present invention is described in detail below by taking the preparation of indium phosphide as an example. In this example, the metallic raw material in the synthesis crucible 17 is pure indium 48 and the non-metallic raw material on the loader 16-2 of the synthesis injection system 16 is red phosphorus 50.

1. Assembly of the System.

The upper furnace body 2 is connected to the upper furnace cover 2-1 and moves onto the upper furnace body support table 5, and the main furnace body 1 moves onto the main furnace body support table 6.

The first insulation sleeve 21, the main heater 19 and the auxiliary heater 19-1 are then assembled to the base 3, respectively. The synthesis crucible 17 is then assembled to the crucible support 18, and the crucible support 18 is assembled to the crucible rod 22. The boron oxide I 47, pure indium 48 and a dopant are put into the synthesis crucible 17.

In the meantime, two synthesis injection systems 16 are assembled to a synthesis rotating rod 15. The first synthesis drive motor 12 and the second synthesis drive motor 13 raise the two synthesis injection systems 16 to the highest positions. The synthesis crucible 17 is brought to the lowest position. The main furnace body 1 is then placed on the base 3.

The upper furnace body 2 is then placed onto the main furnace body support table 6 by means of the upper furnace body driving device 4-1, and then the upper furnace body 2 and the upper furnace cover 2-1 are opened, followed by raising the upper furnace cover 2-1 to a position above the upper furnace body support table 5.

The boron oxide II 47-1 is placed in the storage tank 29-3. The inner side face of the snap ring 11-4 on the adapter fixture 11 is then connected and sealed to the VGF crucible 29 via the second seal rings 11-3, and vacuuming is performed through the suction tube 29-1 to test the sealing condition.

After completion of the above process, the first heater 31, the second heater 32, the third heater 33, the fourth heater 34, and the fifth heater 35 are assembled to the outer side of the VGF crucible support 29-4, then an upper insulation layer 30 is arranged around the above five heaters, and then the above heaters and the VGF crucible support 29-4 are installed in the upper insulation layer housing 28. The fastening screws 49 are inserted into the screw holes 11-5 in the adapter fixture 11, with the nuts of the fastening screws 49 located on the side of the upper insulation layer 30, and then the upper insulation layer housing 28 and the VGF crucible support 29-4 are connected to the adapter fixture 11.

The suction tube heater 36 is assembled around the suction tube 29-1 and a suction tube insulation layer 37 is disposed on the outer side of the suction tube heater 36. The first thermocouple 38, the second thermocouple 39, the third thermocouple 40, and the fourth thermocouple 41 are sequentially disposed in the upper insulation layer 30 and pass through the adapter holes 11-6 in the adapter fixture 11.

Then, the adapter fixture 11 connecting the VGF crucible 29 and the thermocouples to the upper insulation layer 30 is connected to the upper furnace cover 2-1 by fastening screws 49, air leakage along the gap therebetween is prevented through the first seal rings 11-2. At the meantime, the thermocouple wires of the first thermocouple 38, the second thermocouple 39, the third thermocouple 40, and the fourth thermocouple 41 are connected to the outer side of the furnace body of the upper furnace cover 2-1, and the sealing between thermocouple wires and the upper furnace cover 2-1 is achieved. The differential pressure tube 52 and the balance gas tube 11-1 are connected.

The upper furnace cover 2-1 is then moved to a position above the main furnace support table 6 and slowly lowered to place the entire growth system into the upper furnace body 2, and then the upper furnace are 2-1 and upper furnace body 2 are connected.

The upper furnace cover 2-1 and the upper furnace body 2 and the entire crystal growth system are lifted to positions above the main furnace body 1 by means of the upper furnace body driving device 4-1 to achieve the assembly with the main furnace body 1, so that the suction tube 29-1 is inserted into the center of the synthesis crucible 17. The main furnace body 1 and the base 3, and the main furnace body 1 and the upper furnace body 2 are sequentially connected using screws to achieve sealing of the furnace body.

Figure 8:
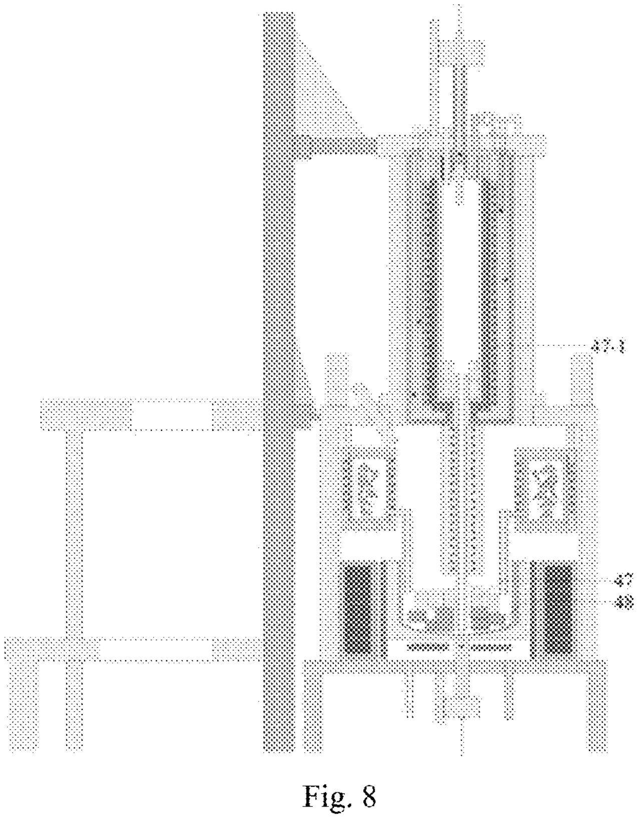
FIG. 8 is a structure diagram of furnace assembly.
Figure 9:
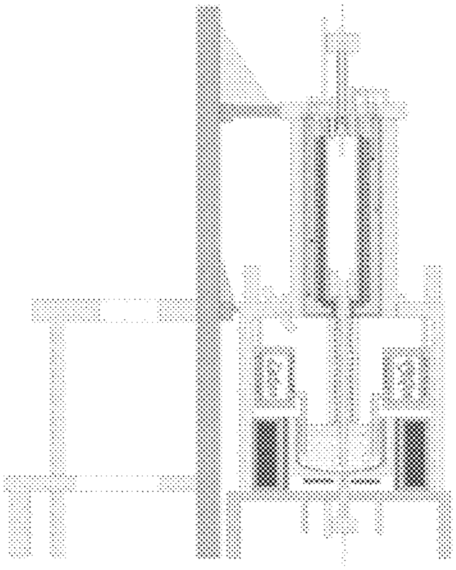
FIG. 9 is a schematic view of synthesis.
Figure 10:
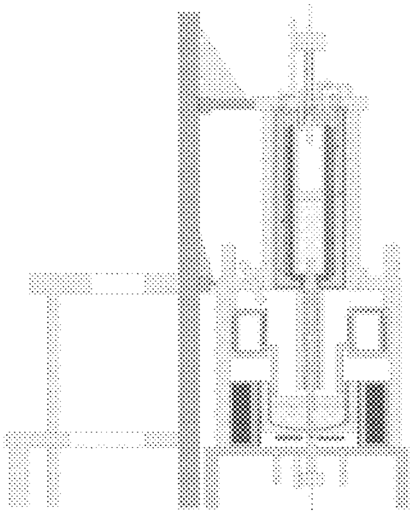
FIG. 10 is a schematic view of first melt or the boron oxide I being sucked back.

2. Preparation of Indium Phosphide.

a, refer to FIGS. 1 and 8, the whole system is vacuumed to $10^5$ Pa to 10 Pa through the vacuum tube 26, and then the system is filled with an inert gas through the gas filling tube 25, with the initial pressure of the gas being 1.5-2.0 MPa.

b, the main heater 19 and the auxiliary heater 19-1 are initiated to heat the synthesis crucible 17 to reach the synthesis temperature (at which pure indium 48 and boron oxide I 47 inside the synthesis crucible 17 are melted); and then the crucible support driving device raises the synthesis crucible 17 to the desired crucible position for synthesis.

c, refer to FIGS. 9 and 10, the first heater 31, the second heater 32, the third heater 33, the fourth heater 34, the fifth heater 35, and the suction tube heater 36 are simultaneously controlled in such a way that the temperature within the VGF crucible 29 is above the melting point of indium phosphide while the boron oxide II 47-1 is melted. The two synthesis injection systems 16 are then lowered in sequence for synthesis.

If the optimal position of the synthesis crucible at this point allows the suction tube 29-1 to enter the first melt 20 or the boron oxide I 47, the synthesis is performed while slowly injecting the inert gas into the VGF crucible 29 through the balance gas tube 11-1 and injecting gas bubbles into the first melt 20 through the suction tube 29-1, so that the melt in the suction tube 29-1 can be discharged to participate in the synthesis process and to prevent the occurrence of the first melt 20 or the boron oxide I 47 being sucked back during the synthesis. The rate of bubbling is 0.5-20 bubbles per second, and the bubbling situations in the injection synthesis tube 16-3 and the suction tube 29-1 are observed through the lower observation window 14.

After completion of the synthesis, raising the synthesis injection systems 16 causes the injection synthesis tubes 16-3 to detach from the first melt 20. The injection of the gas into the VGF crucible 29 is stopped such that the suction tube 29-1 remains 1-5 mm from the bottom of the synthesis crucible 17.

d, the pressure inside the VGF crucible 29 is slowly reduced through the balance gas tube 11-1 such that the pressure inside the VGF crucible 29 is lower than the pressure value inside the main furnace body 1; the pressure reduction is stopped when the pressure difference reaches ρ gh, ρ being the density of the melt, h being the difference between the maximum rising value of the second melt 45 in the VGF crucible 29 and the liquid level of the first melt 20; and the pressure difference between the pressure inside the VGF crucible 29 and the pressure inside the furnace body is measured through the differential pressure gauge 51, and then according to the change of the numeric value of the differential pressure gauge 51, the pressure in the VGF crucible 29 is slightly adjusted through the balance gas tube 11-1 to ensure a constant pressure difference.

e, the first heater 31, the second heater 32, the third heater 33, the fourth heater 34, and the fifth heater 35 are then controlled to obtain a temperature gradient of 20-50

Figure 11:
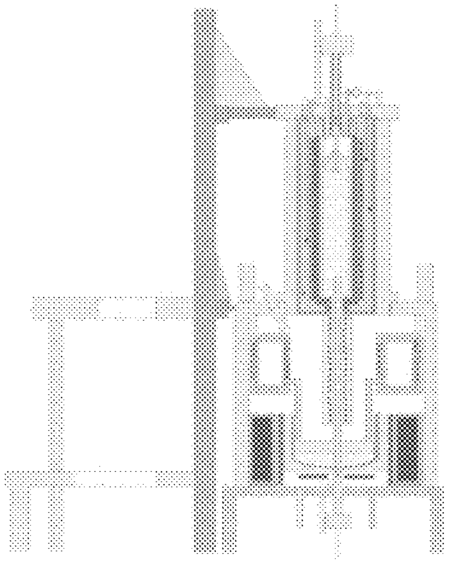
FIG. 11 is a schematic view of growth of LEC seeding and diameter-enlarging crystals.

K/cm in the second melt 45. A temperature gradient of 100-150 K/cm is also obtained in the boron oxide II 47-1.

f, refer to FIG. 11, stopping rotating and pulling of the seed crystal is initiated to lower the seed crystal until the seed crystals 44 comes into contact with the second melt 45 for crystal growth, the seeding rate being 0.5 mm/h to 20 mm/h, and the corresponding rate of temperature reduction being 0.2K/h to 25 °C/h.

Figure 12:
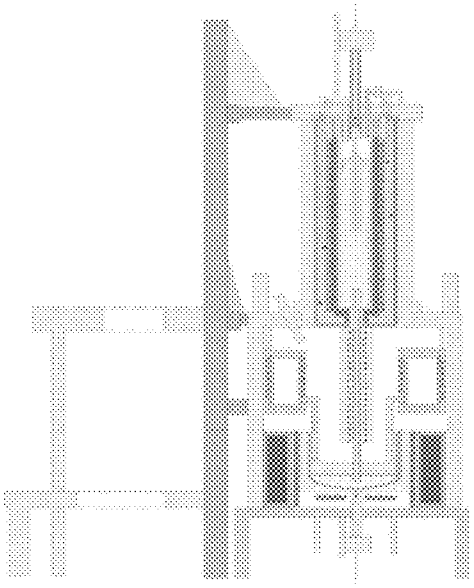
FIG. 12 is a schematic view of growth of a VGF crystal.

When the size of the crystal 46 is 5 mm close to the crucible wall of the VGF crucible 29, the rotating and pulling of the seed crystal are stopped.

g, refer to FIG. 12, the first heater 31, the second heater 32, the third heater 33, the fourth heater 34, and the fifth heater 35 are readjusted so that the second melt 45 obtains a temperature gradient of 3-5 K/cm to control the VGF growth. The pressure values inside the VGF crucible 29 and inside the main furnace body 1 are maintained at ρ gh at all times in this process.

h, after completion of temperature reduction, the solidification of the second melt 45 inside the VGF crucible 29 is completed. The synthesis crucible 17 is then lowered such that the suction tube 29-1 is detached from the boron oxide I 47. The heating of all systems is stopped.

The entire system is vented to the atmospheric pressure. As the seed crystal 44 and the crystal are connected together, at which point the seed crystal rod 9 is inverted to detach the seed crystal rod 9 from the seed crystal holder 43 to facilitate subsequent detachment of the adapter fixture 11 from the seed crystal rod 9. The screws between the upper furnace body 2 and the main furnace body 1 are then unscrewed, and the upper furnace body 2 is raised until the low end of the suction tube 29-1 leaves the main furnace body 1. The main furnace body 1 is then moved onto the main furnace body support table 6 by the main furnace body drive motor 4-3. The wires connecting the first thermocouple 38, the second thermocouple 39, the third thermocouple 40, and the fourth thermocouple 41 to the adapter fixture 11 are loosened, and then the fastening screws 49 are unscrewed, and the entire crystal growth system is slowly removed through the upper furnace body 2.

After that, the adapter fixture 11 and the VGF crucible 29 in the crystal growth system are disassembled, and the adapter fixture 11 and the upper insulation shell 28 are disassembled to remove the VGF crucible 29, then the VGF crucible 29 is broken to remove the crystal 46, and the boron oxide and adhesive quartz residue on the surface of the crystal 46 are removed through ultrasonic cleaning, etc.

For a 4-inch indium phosphide crystal, the dislocation in the LEC growth part at the head is about $10^4$ $cm^{-2}$; the dislocation of the part 3 cm below the shoulder turning is about 1000-3000 $cm^{-2}$; and the dislocation in the 6 cm lower part of the VGF growth part below the shoulder turning is about 100 to 500 $cm^{-2}$.

Finally, it should be noted that the above examples are only used to illustrate the technical solutions of the present invention, instead of limiting the same. Although the present invention has been described in detail with reference to preferred examples, those of ordinary skill in the art should understand that the specific embodiments of the present invention can be modified or a part of the technical features can be equivalently substituted without departing from the spirit of the technical solutions of the present invention, and all the modifications and substitutions should be compassed in the scope of the technical solutions claimed by the present invention.

What is claimed is:

1. A method for preparing a compound semiconductor crystal by continuous LEC and VGF combination after injection synthesis, which is based on a system for preparing compounds, the system comprising a main furnace body, an upper furnace body located above the main furnace body, a synthesis crucible and an injection synthesis system located in the main furnace body, and a VGF crucible and a seed crystal rod located in the upper furnace body, the synthesis crucible being filled with a metallic raw material and boron oxide I, the VGF crucible being filled with boron oxide II, the VGF crucible being provided with a suction tube at the bottom, and the synthesis injection system being filled with a non-metallic raw material, wherein the method comprises the following steps:

step A, vacuuming the system for preparing compounds to 10-5 Pa to 10 Pa, and then filling the system with an inert gas;

step B, heating the synthesis crucible to the synthesis temperature by a matching heating system to melt the metallic raw material and the boron oxide I in the synthesis crucible and then moving the synthesis crucible upwards to the synthesis position;

step C, heating the VGF crucible to a temperature above the melting point of the compound semiconductor crystal through a matching heating system and to melt the boron oxide II in the VGF crucible, moving the synthesis injection system downwards to move the end of the injection synthesis tube until the metallic raw material in the synthesis crucible is synthesized into a first melt, and after the synthesis is completed, moving the synthesis injection system upwards so that the end of the injection synthesis tube is detached from the first melt;

step D, reducing the pressure inside the VGF crucible so that the first melt in the synthesis crucible enters into the VGF crucible via a suction tube to form a second melt;

step E, heating the VGF crucible such that the second melt therein obtains a temperature gradient of 20-50 K/cm and the boron oxide II obtains a temperature gradient of 100-150 K/cm;

step F, initiating rotation and lowering of the seed crystal, lowering the seed crystal rod until the seed crystal comes into contact with the second melt, then lifting the seed crystal rod for crystal growth, and stopping the rotation and pulling of the seed crystal when the crystal is a first distance from a crucible wall of the VGF crucible;

step G, after completion of the crystal growth, adjusting the heating temperature so that the second melt obtains a temperature gradient of 3-5 K/cm, to control VGF growth; and step H, after completion of temperature reduction, stopping the heating and communicating the interior of the system with the atmosphere, and removing the crystal.

2. The method for preparing a compound semiconductor crystal by continuous LEC and VGF combination after injection synthesis according to claim 1, wherein in step C, the inert gas is filled into the VGF crucible via a balance gas tube while synthesizing, the inert gas injects bubbles into the first melt via the suction tube at a rate of 0.5-20 bubbles per second; and after completion of the synthesis, stopping the injection of the inert gas into the VGF crucible, and keeping the suction tube at a distance of 1-5 mm from the bottom of the synthesis crucible.

3. The method for preparing a compound semiconductor crystal by continuous LEC and VGF combination after injection synthesis according to claim 1, wherein in step E, the rate of seeding in this step is 0.5 mm/h to 20 mm/h, and the corresponding rate of temperature reduction is 0.2 K/h-25 °C/h.

4. The method for preparing a compound semiconductor crystal by continuous LEC and VGF combination after injection synthesis according to claim 1, wherein the thickness of the melted boron oxide II in the VGF crucible is greater than 2.5 cm.

5. The method for preparing a compound semiconductor crystal by continuous LEC and VGF combination after injection synthesis according to claim 1, wherein an extension tube is disposed at the top of the suction tube, the extension tube cooperates with the inner wall of the VGF crucible to form a storage tank accommodating the boron oxide II, and the volume of the storage tank is greater than the volume of the melted boron oxide II.

6. The method for preparing a compound semiconductor crystal by continuous LEC and VGF combination after injection synthesis according to claim 1, wherein the main furnace body is fixed to a base, and the base is provided with a gas filling tube and a vacuum tube.

7. The method for preparing a compound semiconductor crystal by continuous LEC and VGF combination after injection synthesis according to claim 1, wherein the synthesis crucible is provided within the main furnace body with the aid of a crucible support, and a crucible support driving device for driving the crucible support to rotate and move up and down is provided below the main furnace body.

8. The method for preparing a compound semiconductor crystal by continuous LEC and VGF combination after injection synthesis according to claim 1, wherein the VGF crucible is connected to an upper furnace cover of the upper furnace body with the aid of an adapter fixture.

9. The method for preparing a compound semiconductor crystal by continuous LEC and VGF combination after injection synthesis according to claim 1, wherein a balance gas tube for adjusting the pressure in the VGF crucible is connected to the upper part of an adapter fixture, and the balance gas tube passes upwards through an upper furnace cover and is connected to a differential pressure tube.

* * * * *